US006791191B2

(12) United States Patent
Chow et al.

(10) Patent No.: US 6,791,191 B2
(45) Date of Patent: Sep. 14, 2004

(54) INTEGRATED CIRCUITS PROTECTED AGAINST REVERSE ENGINEERING AND METHOD FOR FABRICATING THE SAME USING VIAS WITHOUT METAL TERMINATIONS

(75) Inventors: Lap-Wai Chow, South Pasadena, CA (US); James P. Baukus, Westlake Village, CA (US); William M. Clark, Jr., Camarillo, CA (US)

(73) Assignee: HRL Laboratories, LLC, Malibu, CA (US)

( * ) Notice: Subject to any disclaimer, the term of this patent is extended or adjusted under 35 U.S.C. 154(b) by 194 days.

(21) Appl. No.: 09/768,911

(22) Filed: Jan. 24, 2001

(65) Prior Publication Data

US 2002/0096777 A1 Jul. 25, 2002

(51) Int. Cl.[7] .................. H01L 23/48; H01L 23/52; H01L 29/40
(52) U.S. Cl. ................ 257/775; 257/774; 257/773; 438/638; 438/926
(58) Field of Search ................ 257/712, 713, 257/717, 773, 774, 775, 779, 659; 438/622, 638, 926

(56) References Cited

U.S. PATENT DOCUMENTS

| 3,673,471 A | 6/1972 | Klein et al. ............. 317/235 R |
| 3,946,426 A | 3/1976 | Sanders ........................ 357/71 |
| 4,017,888 A | 4/1977 | Christie et al. ............... 357/54 |

(List continued on next page.)

FOREIGN PATENT DOCUMENTS

| EP | 0 364 769 | 4/1990 |
| EP | 0 463 373 | 1/1992 |
| EP | 0 528 302 A1 | 2/1993 |

(List continued on next page.)

OTHER PUBLICATIONS

U.S. patent application Publication 2002/0063268, Vajana et al., May 30, 2002.*
Wolf, Silicon Processing for the VLSI Era–vol. 2:Process Integration, Lattice Press, 1990, pp. 194–199, 387, 482 and 508.*
Document No. 02237038, dated Dec. 6, 1990, Patent Abstracts of Japan, vol. 014, No. 550 (E–1009).
Document No. 63129647, dated Jun. 2, 1988, Patent Abstracts of Japan, vol. 012, No. 385 (E–668), Oct. 14, 1998.
Patent Abstracts of Japan, vol. 016, No. 197 (p–1350) May 12, 1992 & JP–A–40 28 092 (Toshiba Corp), abstract.
Fredericksen, T.M., "A Multiple–Layer–Metal CMOS Process," *Intuitive CMOS Electronics*, Revised Edition, Section 5.6, pp. 134–146 (1989).
Hodges and Jackson, *Analysis and Design of Digital Integrated Circuits*, 2nd edition, McGraw–Hill, p. 353 (1988).
Larson, L.E., et al., "Microactuators for GaAs–based Microwave Integrated Circuits," *IEEE*, pp. 743–746 (1991).
Lee, "Engineering a Device for Electron–beam Probing," *IEEE Design sand Test of Computers, pp. 36–49 (1989)* (1983).
Sze, S.M., ed. *VLSI Technology*, McGraw–Hill, pp. 99, 447, and 461–465 (1983).
Sze, S.M., ed., "Silicides for Gates and Interconnections," *VLSI Technology*, McGraw–Hill, pp. 372–380 (1983).

(List continued on next page.)

Primary Examiner—David A. Zarneka
(74) Attorney, Agent, or Firm—Ladas & Parry

(57) ABSTRACT

A device adapted to protect integrated circuits from reverse engineering comprising a part looking like a via connecting two metal layers, but in fact attached only to one metal layer and spaced from the other. Having such "trick" via would force a reverse engineer to think there is a connection where there is none. A method for fabricating such device.

21 Claims, 1 Drawing Sheet

U.S. PATENT DOCUMENTS

| | | | |
|---|---|---|---|
| 4,139,864 A | 2/1979 | Schulman | 358/188 |
| 4,164,461 A | 8/1979 | Schilling | 204/192 EC |
| 4,196,443 A | 4/1980 | Dingwall | 357/68 |
| 4,267,578 A | 5/1981 | Vetter | 364/709 |
| 4,291,391 A | 9/1981 | Chatterjee et al. | 365/184 |
| 4,295,897 A | 10/1981 | Tubbs et al. | 148/1.5 |
| 4,314,268 A | 2/1982 | Yoshioka et al. | 357/48 |
| 4,317,273 A | 3/1982 | Guterman et al. | 29/571 |
| 4,374,454 A | 2/1983 | Jochems | 29/571 |
| 4,409,434 A | 10/1983 | Basset et al. | 380/265 |
| 4,435,895 A | 3/1984 | Parillo | 29/571 |
| 4,471,376 A | 9/1984 | Morcom et al. | 357/71 |
| 4,581,628 A | 4/1986 | Miyauchi et al. | 357/71 |
| 4,583,011 A | 4/1986 | Pechar | 307/440 |
| 4,603,381 A | 7/1986 | Guttag et al. | 364/200 |
| 4,623,255 A | 11/1986 | Suszko | 356/389 |
| 4,727,493 A | 2/1988 | Taylor, Sr. | 364/490 |
| 4,766,516 A | 8/1988 | Ozdemir et al. | 361/380 |
| 4,799,096 A | 1/1989 | Koeppe | 357/42 |
| 4,821,085 A | 4/1989 | Haken et al. | 357/67 |
| 4,830,974 A | 5/1989 | Chang et al. | 437/34 |
| 4,939,567 A | 7/1990 | Kenney | 257/383 |
| 4,962,484 A | 10/1990 | Takeshima et al. | 365/226 |
| 4,975,756 A | 12/1990 | Haken et al. | 357/4.1 |
| 4,998,151 A | 3/1991 | Korman et al. | 257/328 |
| 5,030,796 A | 7/1991 | Swanson et al. | 174/52.2 |
| 5,050,123 A | 9/1991 | Castro | 365/53 |
| 5,061,978 A | 10/1991 | Mizutani et al. | 357/30 |
| 5,065,208 A | 11/1991 | Shah et al. | 357/34 |
| 5,068,697 A | 11/1991 | Noda et al. | 357/23.5 |
| 5,070,378 A | 12/1991 | Yamagata | 357/23.5 |
| 5,101,121 A | 3/1992 | Sourgen | 307/465 |
| 5,117,276 A | 5/1992 | Thomas et al. | 357/71 |
| 5,121,089 A | 6/1992 | Larson et al. | 333/107 |
| 5,121,186 A | 6/1992 | Wong et al. | 257/384 |
| 5,132,571 A | 7/1992 | McCollum et al. | 307/465.1 |
| 5,138,197 A | 8/1992 | Kuwana | 307/449 |
| 5,146,117 A | 9/1992 | Larson | 307/465 |
| 5,168,340 A | 12/1992 | Nishimura | 357/376 |
| 5,202,591 A | 4/1993 | Walden | 307/450 |
| 5,227,649 A | 7/1993 | Chapman | 257/204 |
| 5,231,299 A | 7/1993 | Ning et al. | 257/316 |
| 5,302,539 A | 4/1994 | Haken et al. | 437/41 |
| 5,308,682 A | 5/1994 | Morikawa | 428/195 |
| 5,309,015 A | 5/1994 | Kuwata et al. | 257/659 |
| 5,336,624 A | 8/1994 | Walden | 437/34 |
| 5,341,013 A | 8/1994 | Koyanagi et al. | 257/368 |
| 5,354,704 A | 10/1994 | Yang et al. | 437/52 |
| 5,369,299 A | 11/1994 | Byrne et al. | 257/638 |
| 5,371,390 A | 12/1994 | Mohsen | 257/209 |
| 5,376,577 A | 12/1994 | Roberts et al. | 437/52 |
| 5,384,472 A | 1/1995 | Yin | 257/204 |
| 5,399,441 A | 3/1995 | Bearinger et al. | 428/689 |
| 5,441,902 A | 8/1995 | Hsieh et al. | 437/34 |
| 5,468,990 A | 11/1995 | Daum | 257/632 |
| 5,475,251 A | 12/1995 | Kuo et al. | 257/316 |
| 5,506,806 A | 4/1996 | Fukushima | 365/195 |
| 5,531,018 A | 7/1996 | Saia et al. | 29/622 |
| 5,539,224 A | 7/1996 | Ema | 257/211 |
| 5,541,614 A | 7/1996 | Lam et al. | 343/792.5 |
| 5,571,735 A | 11/1996 | Mogami et al. | 437/41 |
| 5,576,988 A | 11/1996 | Kuo et al. | 365/185.04 |
| 5,611,940 A | 3/1997 | Zettler | 73/514.16 |
| 5,638,946 A | 6/1997 | Zavracky | 200/181 |
| 5,679,595 A | 10/1997 | Chen et al. | 437/52 |
| 5,719,422 A | 2/1998 | Burr et al. | 257/336 |
| 5,719,430 A | 2/1998 | Goto | 257/403 |
| 5,721,150 A | 2/1998 | Pasch | 437/46 |
| 5,783,846 A | 7/1998 | Baukus et al. | 257/204 |
| 5,838,047 A | 11/1998 | Yamauchi et al. | 257/372 |
| 5,854,510 A | 12/1998 | Sur, Jr. et al. | 257/529 |
| 5,866,933 A | 2/1999 | Baukus et al. | 257/368 |
| 5,880,503 A | 3/1999 | Matsumoto et al. | 257/372 |
| 5,920,097 A | 7/1999 | Horne | 257/368 |
| 5,930,663 A | 7/1999 | Baukus et al. | 438/598 |
| 5,973,375 A | 10/1999 | Baukus et al. | 257/399 |
| 5,977,593 A | 11/1999 | Hara | 257/356 |
| 6,046,659 A | 4/2000 | Loo et al. | 333/262 |
| 6,054,659 A | 4/2000 | Lee et al. | 200/181 |
| 6,057,520 A | 5/2000 | Goodwin-Johansson | 200/181 |
| 6,117,762 A | 9/2000 | Baukus et al. | 438/618 |
| 6,154,388 A | 11/2000 | Oh | 365/185.04 |
| 6,215,158 B1 | 4/2001 | Choi | 257/368 |
| 6,294,816 B1 | 9/2001 | Baukus et al. | 257/368 |
| 6,326,675 B1 | 12/2001 | Scott et al. | 257/608 |

FOREIGN PATENT DOCUMENTS

| | | | |
|---|---|---|---|
| EP | 0 585 601 A1 | | 3/1994 |
| EP | 0 764 985 A2 | | 3/1997 |
| EP | 0 883 184 A2 | | 12/1998 |
| EP | 1193758 | * | 3/2002 |
| JP | 58-190064 | | 11/1983 |
| JP | 61-147551 | * | 7/1986 |
| JP | 63 129647 A | | 6/1988 |
| JP | 02-046762 | | 2/1990 |
| JP | 02-237038 | | 9/1990 |
| JP | 2001118845 | * | 4/2001 |
| JP | 2001284357 | * | 10/2001 |
| WO | 98/21734 | | 5/1998 |
| WO | WO 98/57373 | * | 12/1998 |
| WO | 00/44012 | | 7/2000 |

* cited by examiner

INTEGRATED CIRCUITS PROTECTED AGAINST REVERSE ENGINEERING AND METHOD FOR FABRICATING THE SAME USING VIAS WITHOUT METAL TERMINATIONS

I. BACKGROUND OF THE INVENTION

1. Field of the Invention

This invention relates to the field of the prevention of reverse engineering of integrated circuits and/or making such reverse engineering so difficult and time-consuming as to make reverse engineering of integrated circuits non-feasible.

More particularly, this invention relates to using, in order to prevent and/or discourage such reverse engineering, vias (i.e., holes etched in the oxide layers between metal layers and then filled with metal to affect a connection between metal layers) either not beginning on a metal layer or not terminating on a metal layer.

2. Description of the Related Art

The design and development of semiconductor integrated circuits require a thorough understanding of the complex structures and processes and involve many man-hours of work requiring high skill, costing considerable sums of money.

In order to avoid this time and effort, some developers resort to the practice of reverse engineering, disassembling existing devices manufactured by somebody else, and closely examining them to determine the physical structure of the integrated circuit, followed by slavishly copying the device. Thus, by obtaining a planar optical image of the circuits and by studying and copying them, typically required product development efforts are circumvented.

Such practices hurt the true developer of the product and impairs its competitiveness in the market-place, because the developer had to spend significant amounts of time and effort for the development, while the reverse engineer did not have to.

A number of approaches has been used in order to frustrate such reverse engineering attempts, particularly in the field of semiconductor integrated circuits.

For instance, U.S. Pat. No. 5,866,933 to Baukus, et. al. teaches how transistors in complementary metal oxide-semiconductor (CMOS) circuit can be connected by implanted, hidden and buried lines between the transistors. This hiding is achieved by modifying the p+ and n+ source/drain masks. The implanted interconnections are further used to make a 3-input AND-circuit look substantially the same as a 3-input OR-circuit.

Furthermore, U.S. Pat. No. 5,783,846 to Baukus, et. al. and U.S. Pat. No. 5,930,663 to Baukus et. al. teach a further modification in the source/drain implant masks, so that the implanted connecting lines between transistors have a gap inserted, the length of which is approximately the length of the feature size of the CMOS technology being used. These gaps are called "channel blocks."

If the gap is "filled" with one kind of implant (depending on whether the implanted connecting line is "p" or "n"), the line conducts; if another kind of implant is used for the gap-filling, the line does not conduct. The reverse engineer must determine connectivity on the basis of resolving the "n" or "p" implant at the minimum feature size of the channel block. In addition, transistor sizes and metal connection routings are modified, in order to deprive the reverse engineer of using clues with which he can find inputs, outputs, gate lines and so on as keys to the circuit functionality.

Practicing the inventions taught in the above-mentioned patents to secure an integrated circuit causes the reverse engineer to perform steps that are not always needed. These steps include: decomposing the circuit layer by layer, careful processing of each layer followed by imaging of the layer with exact registration to other layers, and having the required process to image and determine small area implants of specifically both and p-types.

Once a particular standard circuit functionality has been determined, the reverse engineer will attempt to find some signature in the metal layers of that standard circuit which can exactly indicate the presence of that particular standard circuit in other places in the integrated circuit. If this can be done, that information can be entered into the reverse engineer's data base and automatic pattern recognition of the metal pattern is used to determine the circuit, without need for the extensive delayering. This would save considerable time and effort.

Therefore, there still exists a need for an inexpensive, easy-to-implement defensive method which can help to provide the enhanced protection against the reverse engineering of semiconductor integrated circuits, in particular to make such a signature impossible to determine. The present invention provides such a method.

II. SUMMARY OF THE INVENTION

This invention makes the use of vias to provide connections between metal layers unpredictable and difficult to be determined accurately. Hence, the circuit will appear to be one thing, while in fact it is something else. This is a good way to prevent reverse engineering.

Modern integrated circuits are constructed such that signals are routed between circuit/logic blocks (or sometimes between transistors within a single circuit/logic block) and input/output ports, via metallic lines. For purposes of compaction, more than one metal layer is used, the metal layers being separated by a deposited insulating layer, both metal layers being disposed on top of the semiconductor substrate. Connections between these metal lines are accomplished by using vias, for example, holes etched in the insulating layer between metals. The vias are filled with a metal, typically, tungsten.

The gravamen of the present invention is to provide vias which either do not begin or do not terminate on a metal layer. Such non-metal terminating vias will look like an interconnection between adjacent metal layers/lines to the reverse engineer, but they in fact provide no such interconnection.

Such non-metal terminating vias will make it very difficult for a reverse engineer to determine what the signal routing pattern really is, making the process of reverse engineering more expensive and time consuming effectively rendering the circuit secure from such intrusion.

When the reverse engineer observes the top metal layer, dimples in the metal indicate the presence of vias. He will also observe the presence of the via after having removed the top metal layer. However, as a result of etching away the oxide layer between metal layers, down to the lower metal layer, the via is eliminated as well. Therefore, the reverse engineer is likely to assume that the metal layers are connected, because following the via to the lower level, where in fact it is not connected to the lower metal layer, is difficult to accomplish.

The reverse engineer will have to assume the via connects with two metal lines, one in the upper metal layer and one in the lower metal layer, while in fact, the connection is only with, at most, one metal layer.

A first aspect of the invention provides a semiconducting device adapted to prevent and/or to thwart reverse engineering, including an insulating layer disposed on a semiconductor substrate, a first metal layer and a second metal layer, said first metal layer and second metal layer being separated by said insulating layer and a via defined by said insulating layer, said via having a first end and a second end, wherein said first end of said via is connected to said first metal layer and said second end of said via terminates prior to reaching said second metal layer.

A second aspect of the invention provides a semiconducting device adapted to prevent and/or to thwart reverse engineering, including an insulating layer disposed on top of semiconductor substrate a first metal layer and a second metal layer, said first metal layer and second metal layer being separated by said insulating layer, and a via defined by said insulating layer, said via having a first end and a second end, wherein said second end of said via is connected to said second metal layer and said first end of said via terminates prior to reaching said first metal layer.

A third aspect of the invention provides a method for preventing and/or thwarting reverse engineering, comprising steps of disposing an insulating layer on top of semiconductor substrate, forming and patterning a first metal layer and a second metal layer so that said first metal layer and said second metal layer are separated by said insulating layer and forming a via defined by said insulating layer, said via having a first end and a second end, wherein said first end of said via is connected to said first metal layer and said second end of said via terminates prior to reaching said second metal layer.

A fourth aspect of the invention provides a method for preventing and/or thwarting reverse engineering, comprising steps of disposing an insulating layer on top of semiconductor substrate, forming and patterning a first metal layer and a second metal layer so that said first metal layer and said second metal layer are separated by said insulating layer, and forming a via defined by said insulating layer, said via having a first end and a second end, wherein said second end of said via is connected to said second metal layer and said first end of said via terminates prior to reaching said first metal layer.

III. BRIEF DESCRIPTION OF THE DRAWINGS

The features and advantages of the present invention will become better understood with regard to the following description, appended claims, and accompanying drawings where FIG. 1 is a schematic diagram showing a typical via connecting two metal layers.

IV. DETAILED DESCRIPTION OF THE INVENTION

Figure 1:
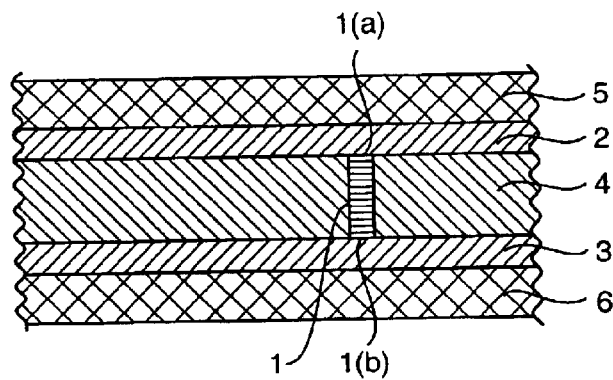

FIG. 1 shows a usual via 1 connecting an upper metal layer 2 and a lower metal layer 3. The via 1 has two ends: a first end 1(a) and a second end 1(b). The upper and lower metal layers are separated by an insulating layer 4, typically made of silicon oxide. Insulating layers 5 and 6, typically, occur above and below metal layers 2 and 3. The insulating layers 4, 5 and 6 are disposed in a semiconductor device, preferably, an integrated circuit (not shown). The via 1 is filled with a metal, typically the same metal as the metal of metal layers 2 and 3, this metal usually being tungsten.

Figure 2:
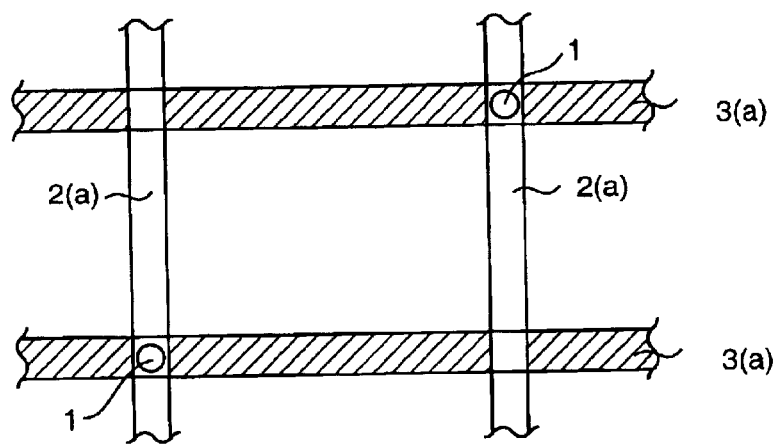
FIG. 2 is a schematic diagram showing how metal lines are located relative to one another.

FIG. 2 shows that metal lines 2(a) and 3(a), within the two metal layers 2 and 3, respectively, do not typically run parallel. They are disposed in parallel planes, but the signal metal lines 2(a) and 3(a) are not parallel. Instead, the metal pattern, when viewed from the top, as shown on FIG. 2, is usually two arrays of lines proceeding in orthogonal directions, when viewed as projected onto a single plane. The metal lines 2(a) and 3(a) lie in different planes.

Figure 2A:
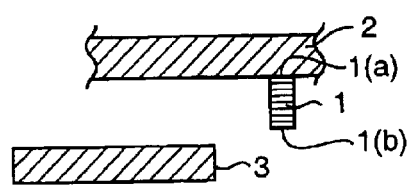
FIG. 2(a) is a schematic diagram showing a via according to one embodiment of this invention, where the via does not terminate on a lower metal layer.
Figure 2B:
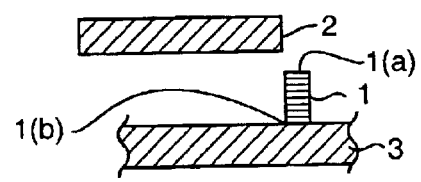
FIG. 2(b) is a schematic diagram showing a via according to another embodiment of this invention where the via does not begin on an upper metal layer.

In order to confuse a reverse engineer, two new structures shown on FIGS. 2(a) and 2(b) are offered, these structures comprising two embodiments of this invention.

FIG. 2(a) schematically depicts a structure, disposed on an integrated circuit (not shown) where the via 1 terminates on the upper metal layer 2, where the first end 1(a) is connected to the upper metal layer 2, but the second end 1(b) does not terminate on the lower metal layer 3. As seen on FIG. 2(a), the second end 1(b) is spaced from the conducting line made from the lower metal layer 3. A portion of insulating layer isolates the second end 1(b) from the lower metal layer 3.

In an alternative embodiment, shown on FIG. 2(b), also used on an integrated circuit (not shown) the via 1 terminates on the lower metal layer 3, but does not terminate on the upper metal layer 2. In this case, the second end 1(b) is connected to the lower metal layer 3, but the first end 1(a) is spaced from and thus isolated from the conducting line in the upper metal layer 2 by a portion of insulating layer.

The vias 1 of both embodiments are manufactured according to common methods of fabrication of vias known to those skilled in the art. Usual design rule allowances, known to those skilled in the art, concerning the minimum spacing between an unterminated end of the via 1 and the metal layer 2 or 3, should be observed.

This invention can be used on any CMOS, bi-polar silicon, or group III–V integrated circuit. The references herein have been with regard to two metal layers. However, a device may have many metal layers and this invention can be used to imply a connection, but not a connect, between any two of many metal layers.

This invention is a circuit trick technique. It can be used together with other techniques disclosed in the previously discussed prior art to prevent reverse engineering. The composite of such previously known techniques is to make the connections between transistors difficult to determine. The reverse engineer will have to carefully analyze each CMOS transistor pair rather that utilize automatic circuit and pattern recognition techniques.

As a part of his or her above-mentioned analysis of each CMOS transistor pair, a reverse engineer is likely to look carefully at the metal traces and via 1 carefully removing one metal layer, determining the location of vias to the layer beneath to see the connection. When viewing the top metal layer 2, the reverse engineer looks for dimples in the top metal surface. These dimples indicate the presence of a via 1 beneath them, and this via 1 ordinarily connects to a metal layer below.

Seeing the dimple, the reverse engineer will, therefore, assume that underneath the dimple there is a via connecting to the metal layer below. He will proceed by checking the correctness of his or her assumption by etching away the top metal layer and noting the via 1 beneath. However, when etching away the via metal, along with the insulating layer 4 surrounding it, it is very difficult for the reverse engineer to determine if the via 1 does indeed terminate on the metal layer below.

By beginning or terminating a via 1 where there is no metal present, this invention will make the reverse engineer's task very difficult. He will assume all sorts of connections where there are none. Should he or she discover his or her error, he or she will have to use cross-sectioning of the circuit to determine where the missing metal portions are and this process is prohibitively expensive and labor-extensive, effectively making the circuit much more secure.

The structures of this invention can be easily inserted into an integrated circuit fabrication process according to techniques known to those skilled in the art. No additional processing steps are needed.

Having described the invention in connection with several embodiments thereof, modification will now suggest itself to those skilled in the art. As such, the invention is not to be limited to the described embodiments except as required by the appended claims.

We claim:

1. A semiconducting device adapted to prevent and/or to thwart reverse engineering, including:
   (a) an insulating layer disposed on a semiconductor substrate;
   (b) a first metal layer and a second metal layer, said first metal layer and second metal layer being separated by said insulating layer; and
   (c) a via defined by said insulating layer, said via having a first end and a second end,
   wherein said first end of said via is connected to said first metal layer and said second end of said via terminates at a termination point without reaching said second metal layer, said termination point be laterally spaced relative to the metal of the second metal layer.

2. The device as claimed in claim 1, wherein said semiconducting device comprises an integrated circuit.

3. The device as claimed in claim 1, wherein said insulating layer further comprises silicon oxide.

4. The device as claimed in claim 2, wherein said integrated circuit further comprises complementary metal oxide-semiconductor, bipolar silicon, or group III–group V integrated circuits.

5. A semiconducting device adapted to prevent and/or to thwart reverse engineering, including:
   (a) an insulating layer disposed on top of semiconductor substrate;
   (b) a first metal layer and a second metal layer, said first metal layer and second metal layer being separated by said insulating layer; and
   (c) a via defined by said insulating layer, said via having a first end and a second end,
   wherein said second end of said via is connected to said second metal layer and said first end of said via terminates at a termination point without reaching said first metal layer, said termination point be laterally spaced relative to the metal of the first metal layer.

6. The device as claimed in claim 5, wherein said semiconducting device comprises an integrated circuit.

7. The device as claimed in claim 5, wherein said insulating layer further comprises silicon oxide.

8. The device as claimed in claim 6, wherein said integrated circuits further comprise complementary metal oxide-semiconductor, bi-polar silicon, or group III–group V integrated circuits.

9. A method for preventing and/or thwarting reverse engineering, comprising steps of:
   (a) disposing an insulating layer on top of semiconductor substrate;
   (b) forming and patterning a first metal layer and a second metal layer so that said first metal layer and said second metal layer are separated by said insulating layer; and
   (c) forming a via defined by said insulating layer, said via having a first end and a second end,
   wherein said first end of said via is connected to said first metal layer and said second end of said via terminates, without reaching said second metal layer, at a point which is laterally spaced relative to the second metal layer.

10. The method as claimed in claim 9, wherein said semiconductor substrate comprises integrated circuits.

11. The method as claimed in claim 9, wherein said insulating layer further comprises silicon oxide.

12. The method as claimed in claim 10, wherein said integrated circuits further comprise complementary metal oxide-semiconductor, bi-polar silicon, or group III–group V integrated circuits.

13. A method for preventing and/or thwarting reverse engineering, comprising steps of:
   (a) disposing an insulating layer on top of semiconductor substrate;
   (b) forming and patterning a first metal layer and a second metal layer so that said first metal layer and said second metal layer are separated by said insulating layer; and
   (c) forming a via defined by said insulating layer, said via having a first end and a second end,
   wherein said second end of said via is connected to said second metal layer and said first end of said via terminates, without reaching said first metal layer, at a point which is laterally spaced relative to the first metal layer.

14. The method as claimed in claim 13, wherein said semiconductor substrate comprises integrated circuits.

15. The method as claimed in claim 13, wherein said insulating layer further comprises silicon oxide.

16. The method as claimed in claim 14, wherein said integrated circuits further comprise complementary metal oxide-semiconductor, bi-polar silicon, or group III–group V integrated circuits.

17. A semiconducting device adapted to prevent and/or to thwart reverse engineering, including:
   (a) an insulating layer disposed on a semiconductor substrate;
   (b) a first metal layer and a second metal layer, said first metal layer and second metal layer being separated by said insulating layer; and
   (c) a via defined by said insulating layer, said via having a first end and a second end,
   wherein one end of said via is connected to one of said first metal layer and said second metal layer and wherein another end of said via terminates at a point which is laterally spaced from a least one of said first metal layer and said second metal layer.

18. A method for making a semiconductor device for preventing and/or thwarting reverse engineering thereof, comprising steps of:
   (a) disposing an insulating layer on a semiconductor substrate;

(b) defining a first electrically conductive layer and a second electrically conductive layer so that said first electrically conductive layer and said second electrically conductive layer are separated by said insulating layer; and (c) defining a via in said insulating layer, said via having a first end and a second end, one of said first and second ends of the via contacting one of said first and second electrically conductive layers the other of said first and second ends of the via being laterally disposed relative to at least one of the first and second electrically conductive layers so that it contacts neither one of said first and second electrically conductive layers whereby said via mimics a connecting via between said first and second electrically conductive layers without making an electrical connection between said first and second metal layers.

19. A semiconductor device for preventing and/or thwarting reverse engineering thereof made according to the method of claim 18.

20. The device as claimed in claim 1 wherein the first metal layer is an upper layer and the second metal layer is a lower layer relative to the insulating layer.

21. The device as claimed in claim 5 wherein the second metal layer is an upper layer and the first metal layer is a lower layer relative to the insulating layer.

* * * * *